United States Patent [19]
Kos

[11] Patent Number: 5,270,482
[45] Date of Patent: Dec. 14, 1993

[54] WAFER CARRIER PROCESS PLATFORM
[75] Inventor: Robert D. Kos, Victoria, Minn.
[73] Assignee: Fluoroware, Inc., Chaska, Minn.
[21] Appl. No.: 889,638
[22] Filed: May 28, 1992
[51] Int. Cl.[5] .............................................. B05C 3/00
[52] U.S. Cl. .................................. 118/500; 206/334; 269/903; 211/41; 118/428
[58] Field of Search .................... 118/728, 729, 428; 211/41; 269/46, 903, 334, 454, 328

[56] References Cited

U.S. PATENT DOCUMENTS 3,486,631  12/1969  Rodman ............................. 211/41
4,609,103  9/1986  Bimer ................................. 206/454

OTHER PUBLICATIONS

Fluoroware, Inc., Commercial Product-admitted prior art 3 drawings attached FIG. 1-Top plan view; Section A—A (see FIG. 1); Section B—B (see FIG. 1).

Primary Examiner—David A. Simmons
Assistant Examiner—Mark De Simone
Attorney, Agent, or Firm—Palmatier, Sjoquist & Helget

[57] ABSTRACT

A process platform for wafer carriers having a floor and a handle extending upwardly from the floor to define two floor portions for engaging wafer carriers on either side of the handle. The floor portions feature structures for orienting the wafer carriers either parallel or perpendicular to the handle and a peripheral gridwork of openings to permit fluid to flow easily through the floor to the wafer carriers. The handle features openings to permit fluid flow therethrough and bifurcated portions extending between the handle and side portions of the floor to lend stiffness to the platform.

16 Claims, 3 Drawing Sheets

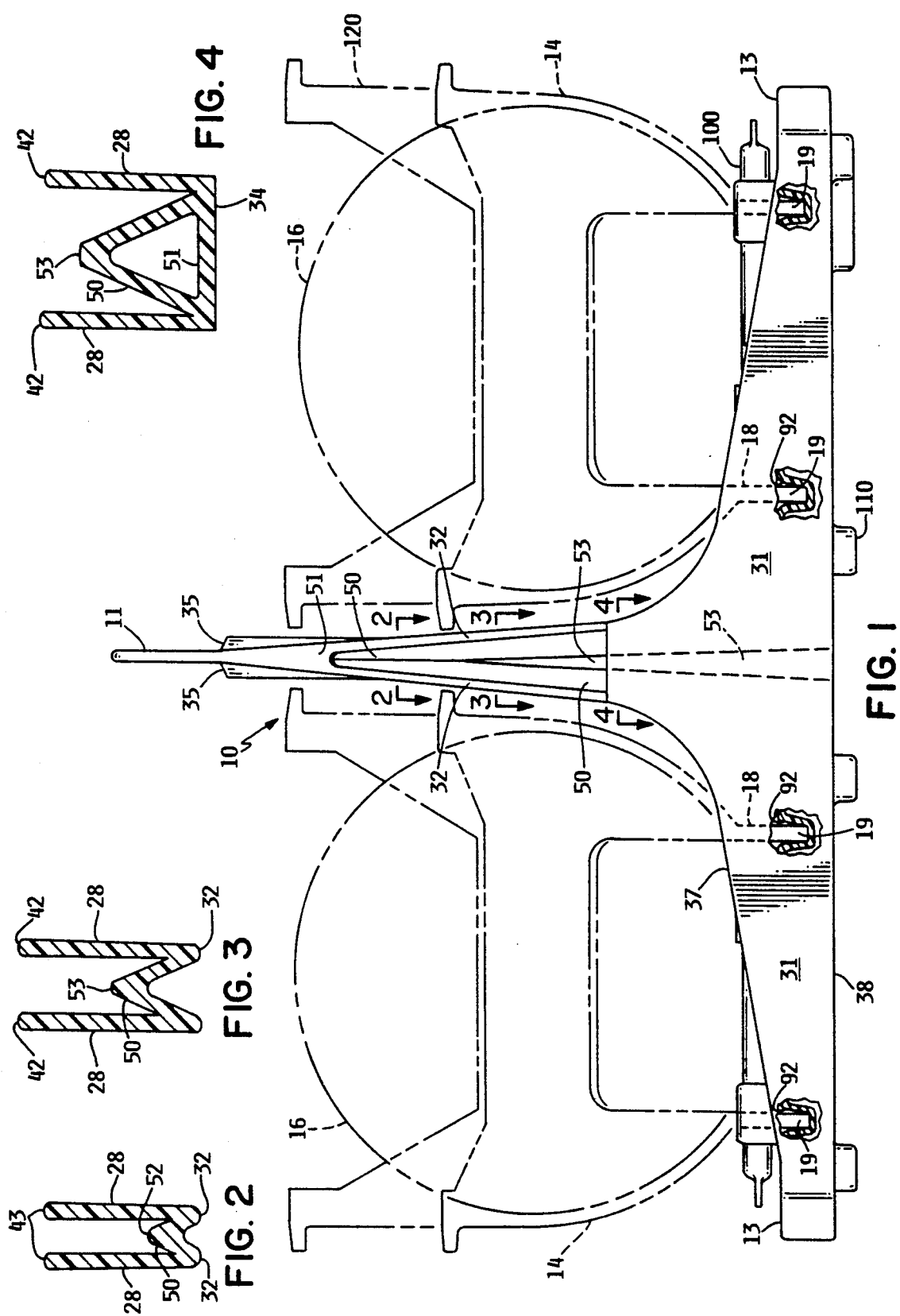

WAFER CARRIER PROCESS PLATFORM

BACKGROUND OF THE INVENTION

The present invention relates to process platforms for wafer carriers and more particularly, to process platforms for engaging wafer carriers designed for holding relatively large semiconductor wafers of up to and in excess of 200 mm in diameter.

A process platform for wafer carriers is a holder for its respective wafer carriers as the wafer carriers are transported between and dipped into various semiconductor processing liquids. A process platform is typically suspended from and manipulated by a robotic handling mechanism.

Process platforms and wafer carriers are exposed to temperatures of up to and beyond 180° C. during treatment of their respective semiconductor wafers. After such treatment, the process platforms, wafer carriers, and wafers are cooled relatively rapidly to ambient temperatures. Such high temperatures and relatively rapid heating and cooling are factors that may contribute undesirably to warpage and distortion of the process platform and wafer carriers.

SUMMARY OF THE INVENTION

A feature of the present invention is the provision in a wafer carrier process platform having a central upright handle and a floor so as to from generally the shape of an inverted T with two floor portions, of engagement means for engaging one wafer carrier on each of the floor portions either parallel or perpendicular to the handle.

Another feature is the provision in such a wafer carrier process platform, of a pair of warpage resistant rods removably engageable with the platform and extending transversely of each other to lend stiffness to the floor of the process platform.

Another feature is the provision in such a wafer carrier process platform, of a bifurcated portion between the handle and upwardly extending side portions of the floor to lend rigidity to the connection between the handle and the floor.

Another feature is the provision in such a wafer carrier process platform, of the floor having a periphery which comprises a gridwork of relatively small openings for permitting fluid flow therethrough and further having a relatively large opening centrally disposed in each of the floor portions immediately below each of the wafer carriers.

An advantage of the present invention is that larger process platforms may be formed for holding larger wafer carriers and wafers.

Another advantage is that larger process platforms may have a greater amount of structural integrity and possess a greater amount of resistance to warpage and distortion which may be caused by relatively rapid heat transfer.

Another advantage is that the present process platform may mount either low or high profile wafer carriers.

BRIEF DESCRIPTION OF THE DRAWINGS

FIG. 1 is a side elevation view of the present wafer carrier process platform partially broken away, and shows wafer carriers and semiconductor wafers in phantom.

FIG. 2 is a section view at lines 2—2 of FIG. 1.

FIG. 3 is a section view at lines 3—3 of FIG. 1.

FIG. 4 is a section view at lines 4—4 of FIG. 1.

DETAILED DESCRIPTION OF THE PREFERRED EMBODIMENTS

Figure 5:
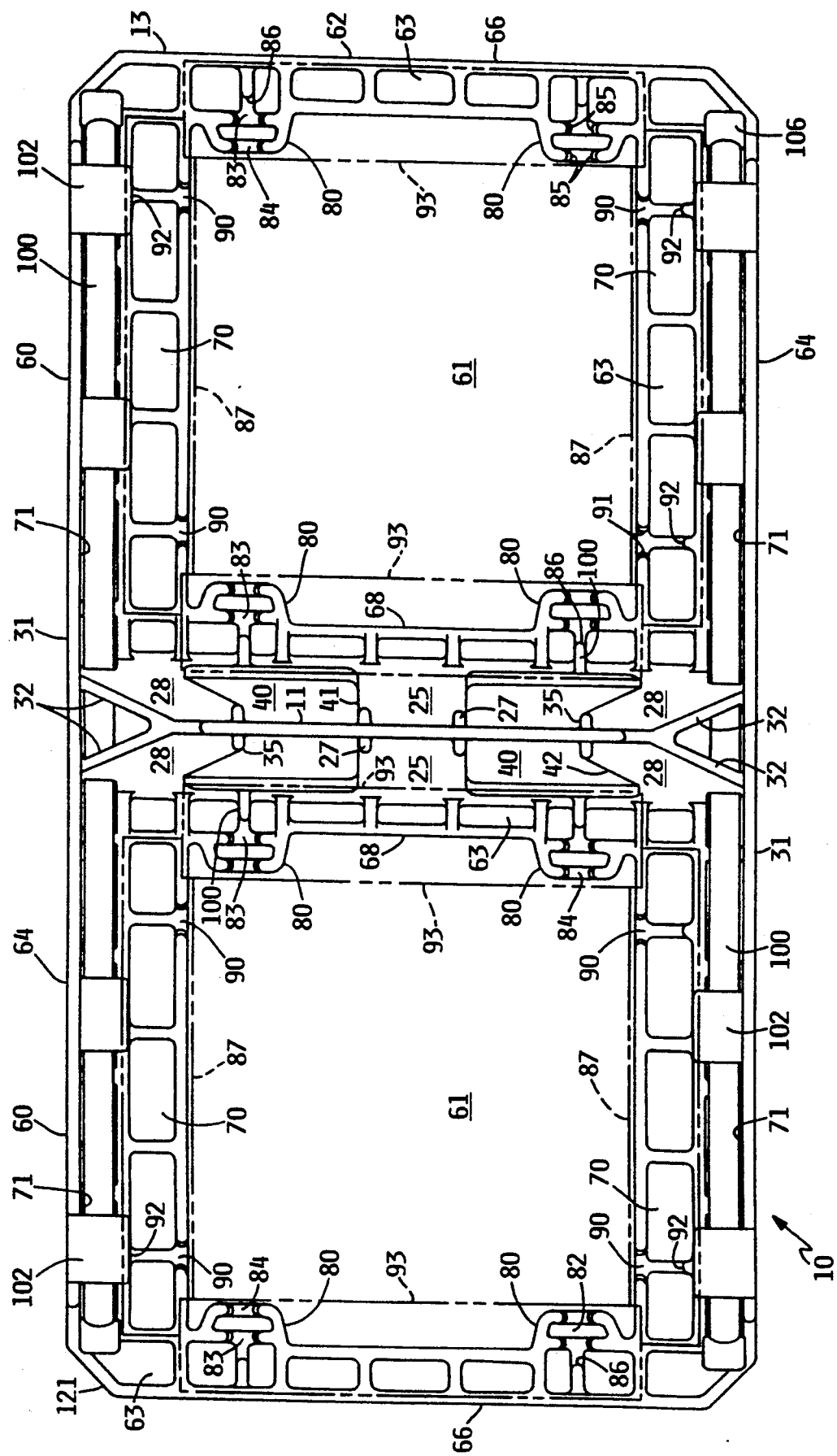
FIG. 5 is a top plan view of the process platform of FIG. 1 showing the two different orientations of each of the wafer carriers in phantom.
Figure 6:
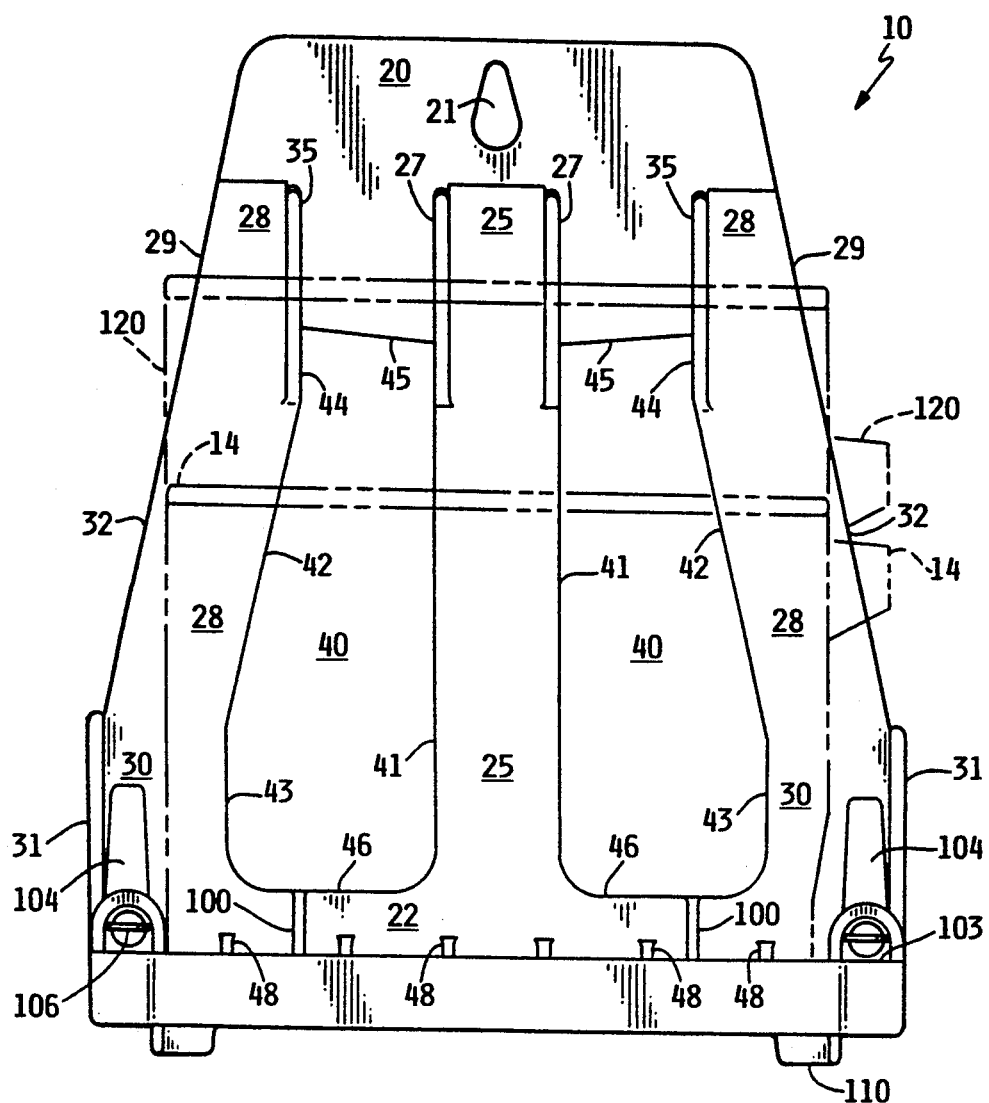
FIG. 6 is an end elevation view of the process platform of FIG. 1, and shows one of the wafer carriers in phantom.
Figure 7:
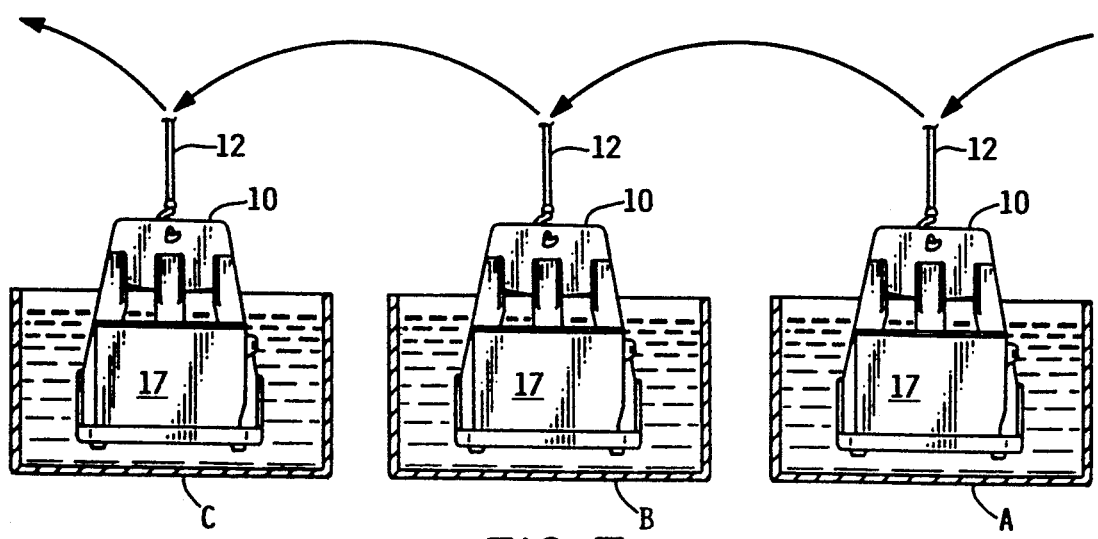
FIG. 7 is an environmental view showing the process platform of FIG. 1 being manipulated by a robotic control and handling mechanism relative to various semiconductor liquid processing stations.

The present process platform is generally indicated by the reference numeral 10 and includes a handle 11 for engaging a robotic handling mechanism 12 and a floor 13 which engages a pair of wafer carriers 14. The wafer carriers 14 hold semiconductor wafers 16. The robotic handling mechanism 12 dips the process platform 10, wafer carriers 14, and wafers 16 into semiconductor liquid processing stations A, B, and C, and transports such between the stations A, B, and C. Each of the wafer carriers 14 includes a ribbed body 17 to permit fluid to flow to the wafers 16, and a pair of transversely extending feet 18 for support relative to a surface. Each foot 18 includes opposite ends 19. As to such a wafer carrier 14, the totality of the Kos U.S. Pat. No. 4,949,848 assigned to Fluoroware, Inc. of Chaska, Minn. is hereby incorporated by reference.

The process platform 10 forms generally the shape of an inverted T with the handle 11 being a generally central support extending upwardly and centrally from the floor 13. The handle 11 includes an upper panel portion 20 with an opening for engagement means 21 for engaging the robotic handling mechanism 12, and lower handle portions 22 integral with the floor 13. The opening 21 defines a center of balance for the process platform 10. A pair of intermediate panel portions 25 are integrally affixed to the upper handle portion 20 and extend downwardly and outwardly therefrom to the lower handle portion 22 to be integrally affixed to the floor 13. In other words, the intermediate panel portions converge upwardly toward each other from the floor 13. A set of ribs 27 is fixed integrally to and between the intermediate panel portions 25 and the upper portion 20 to lend rigidity to the connection between the intermediate panel portions 25 and the handle 11.

The handle 11 further includes a pair of oblique end panel portions 28 disposed on either of sides 29 of the handle 11. Each of the end panel portions 28 converges upwardly and obliquely toward its respective paired panel portion 28 from its respective lower handle portion 22 to the upper handle portion 20. Lower portions 30 of the panel portions 28 are integrally joined with side upright panels 31 which are formed integrally with the floor 13. Each of the end panel portions includes an outer, upwardly converging edge 32. To provide stiffness between the end panel portions 28 and the upper handle portion 20, upwardly extending ribs 35 are integrally molded between oblique end panel portions 28 and the upper handle portion 20. It should be noted that each of the side panel portions 31 includes an upper horizontal edge 36, tapering edges 37 which taper to opposite ends of the floor 13, and a lower horizontal edge 38.

The handle 11 further includes elongate openings 40 to permit fluid to flow easily through the handle 11. The elongate openings are formed by outer vertically extending edges 41 of the intermediate panel portions 25, inner obliquely extending edges 42 of the oblique end panel portions 28, vertically extending edges 43 of the lower panel portions 30, inner vertically extending edges 44 of ribs 35, lower edges 45 of the upper panel portion 20 and upper edges 46 of the lower handle portions 22 which extend between the intermediate panel portions 25 and the oblique end panel portions 28.

Each of the lower handle portions 22 extends laterally across and is fixed integrally to the floor 13 and its respective intermediate and end panel portions 25, 28. Short ribs 48 extend between the lower handle portion 22 and the floor 13 to lend rigidity to the connection between the handle 11 and the floor 13.

To further lend stiffness to the handle 11, an elongate inwardly converging bifurcated portion 50 is integrally formed between each of the paired end panel portions 28. Each of the bifurcated portions 50 extends downwardly from a juncture 51 with their respective end oblique panel portions 28 to the lower edges 38 of the side panel portions 31. Each of the bifurcated portions 50 forms a gusset 51 with its respective side panel portion 31. At an upper portion, each of the bifurcated portions 50 forms a relatively sharp apex 52. At a lower portion, each of the bifurcated portions 50 forms a relatively blunt apex 53 which widens as each of the bifurcated portions 50 extends downwardly.

The handle 11 extends from a central portion of the floor 13 to define a pair of floor portions 60. Each of the floor portions 60 engages one of the wafer carriers 14. Each of the floor portions 60 forms a relatively large opening 61 immediately below its respective wafer carrier 14 to permit unrestricted fluid flow to the wafer carrier 14. The floor 13 further includes an apertured, somewhat rectangular periphery or peripheral gridwork 62 having a plurality of relatively small openings 63 to permit fluid flow therethrough. The peripheral gridwork 62 includes longitudinally extending side portions 64 extending parallel to each other, a pair of end lateral portions 66 extending between and perpendicular to the longitudinal gridwork portions 64, and a pair of inner lateral gridwork portions 68 extending perpendicular to the longitudinal gridwork portions 64 and adjacent to and integral with each of the lower panel portions 22.

Each of the longitudinal gridwork portions 64 includes an inner row of small openings 70 and an outer row of relatively small openings 71. The openings 70, 71 are staggered relative to each other to lend stiffness to the floor 13.

Each of the lateral gridwork portions 66–69 includes a pair of inwardly extending aligned tabs 80 for engaging the feet 18 of the wafer carriers 14. Each of the tabs 80 includes an aperture 82 to permit fluid flow therethrough and a pair of aligned notches 83, 84 into which are received the feet 18 of the wafer carriers 14. Each of the notches 83, 84 includes a pair of edges 85 for minimizing lateral movement of its respective carrier 14. Each of the notches 83 further includes an edge 86 for limiting longitudinal movement of its respective wafer carrier 14. When the tabs 80 engage the wafer carriers 14, each of the wafers 16 are disposed in a plane lying perpendicular to the longitudinal gridwork portions 64 and the wafer carrier feet 18 are disposed perpendicular to the handle 11. Upper portions of the ribbed body 17 of the wafer carriers 14 engaged as such are indicated by the reference numeral 87.

For disposing each of the wafer carriers 14 in an orientation 90° from its orientation when engaged by the tabs 80, notches 90 are utilized. The notches 90 are formed in the longitudinal portions 64 and include edges 91 for minimizing longitudinal movement of the wafer carriers 14. The notches 90 further include edges 92 for limiting later movement of the wafer carriers 16. When the notches 90 engage the wafer carriers 14, the wafers 16 are disposed in a plane lying parallel to the longitudinal gridwork portions 64 and the wafer carrier feet 18 are disposed parallel to the handle 18. Upper portions of the ribbed body 17 of the wafer carriers engaged as such are indicated by the reference numeral 93.

A pair of quartz rods 100 are removably engaged with the floor 13 to lend rigidity to and between the floor portions 60 of the process platform 10. The rods 100 are affixed over the rows of small openings 71 via semicircular integral retainers or retaining means 102. The rods 100 confront upper edges 103 of the peripheral gridwork 62 and extend through openings 104 formed in each of the oblique end panel portions 28 and in each of the bifurcated portions 50. The quartz rods 100 are longitudinally removable from the retainers 102. The quartz rods 100 are cylindrical with flat ends 106 for manipulating the rods 100. The rods 100 may be formed of material which is resistant to warpage and distortion at temperatures of about 180° C. and which is chemically inert with respect to semiconductor processing chemicals. The rods 100 are typically formed of non-plastic materials, but may if desired be formed of plastics resistant to such warpage.

It should be noted that each of the tabs 80 of the inner lateral gridwork portion 68 extends into its respective large openings 61 adjacent a relatively long stiffener rib 100. Each of the stiffener ribs 100 extends integrally from its respective tab 80 to its respective lower handle portion 22 to lend rigidity to its respective tab 80. Each of the stiffener ribs 100 also forms the edge 86 to its respective notch 83.

It should further be noted that the floor 13 includes integral feet 110 for spacing the process platform 10 from a surface to permit a more thorough cleaning and drying of the process platform 10.

It should further be noted that the floor 13 includes corners 121 which are squared off between their respective longitudinal and lateral gridwork portions 64, 66 to further lend rigidity to the floor 13.

It should further be noted that the wafer carrier 14 is a low profile wafer carrier. The process platform 10 also engages high profile wafer carriers 120, as shown in FIG. 1.

It should further be noted that the bifurcated portions 50 and the side panel portions 31 lend support and stiffness to the integral connection between the floor portions 60 of the floor 13, as well as lending stiffness to the connection between the floor 13 and handle 11.

In operation, the process platform 10, with two wafer carriers 14, are dipped into the processing stations A, B, and C, and are transported between the processing stations A, B, and C. As the process platform 10 is dipped into and removed from the caustic, relatively hot liquids of the processing stations A, B, and C, the process platform 10 is subject to warpage, distortion, and bending caused by relatively rapid heat transfer. The process platform 10 tends to resist such forces and tends to maintain its shape by virtue of the quartz rods 100, its overall symmetry which may cause respective portions of the process platform 10 to shrink and expand at the same rate, and the relatively identical thickness of each of the elements of the process platform 10, the bifurcated portions 50, ribs 27, 35, 48, and 100, the gussets 51, and other structures found in the process platform 10. While resisting such forces, the process platform 10 permits relatively unrestricted fluid flow to the wafers being processed.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed:

1. A moldable plastic, distortion and warp resistant process platform for wafer carriers, the process platform being suspendable by a control apparatus for dipping wafer carriers into various liquids for processing semiconductor wafers in the wafer carriers, each of the wafer carriers having pair of feet, the feet being transverse of each other and elongate and generally upright, the process platform comprising:
   a generally central support having upper and lower portions, the upper portion having engagement means for engaging the control apparatus from which the process platform is suspendable;
   a floor for engaging the wafer carriers and being integral with the lower portion of the central support which extends generally upwardly and centrally from the floor to define two floor portions and whereby the process platform forms generally the shape of an inverted T;
   first engagement means molded into each of the floor portions for engaging the feet of one of the wafer carriers and minimizing longitudinal and lateral movement of such wafer carrier, the first means orienting such wafer carrier in a first direction; and
   second engagement means molded into each of the floor portions for engaging the feet of one of the wafer carriers and minimizing longitudinal and lateral movement of such wafer carrier, the second engagement means orienting such wafer carrier in a second direction whereby each of the wafer carriers may be oriented one of two ways in each of the floor portions.

2. The process platform of claim 1, wherein the engagement means includes notches formed in the floor.

3. The process platform of claim 2, and each of the feet of each of the wafer carriers include opposite ends, wherein each of the floor portions include two sets of four notches apiece, each of the notches engaging one of the ends.

4. The process platform of claim 1, wherein the directions are perpendicular to each other.

5. A moldable plastic, distortion and warp resistant process platform for wafer carriers, the process platform being suspendable by a control apparatus for dipping wafer carriers into various liquids for processing semiconductor wafers in the wafer carriers, the process platform comprising:
   a generally central support having upper and lower portions, the upper portion having engagement means for engaging the control apparatus from which the process platform is suspendable;
   a floor for engaging the wafer carriers and being integral with the lower portion of the central support which extends generally upwardly and centrally from the floor to define two floor portions and whereby the process platform forms generally the shape of an inverted T; and
   a pair of warp resistant rods extending transversely of each other and being removably engageable with the floor, each of the rods engageable with each of the floor portions to lend stiffness to the floor.

6. The process platform of claim 5, wherein the rods extend parallel to each other.

7. The process platform of claim 5, wherein the rods are formed of a nonplastic material.

8. A moldable plastic, distortion and warp resistant process platform for wafer carriers, the process platform being suspendable by a control apparatus for dipping wafer carriers into various liquids for processing semiconductor wafers in the wafer carriers, the process platform comprising:
   a generally central support having upper and lower portions, the upper portion having engagement means for engaging the control apparatus from which the process platform is suspendable;
   a floor for engaging the wafer carriers and being integral with the lower portion of the central support which extends generally upwardly and centrally from the floor to define two floor portions and whereby the process platform forms generally the shape of an inverted T; and
   an elongate, upwardly extending bifurcated portion integral with the central support for lending stiffness to the process platform.

9. The process platform of claim 8 and a pair of side portions extending longitudinally and upwardly and being integral with the floor, the side portions being disposed transversely of each other and extending to the floor portions and the central support, the central support being disposed between the side portions wherein each of the bifurcated portions, and its respective side portion forms a gusset.

10. The process platform of claim 8, wherein each of the bifurcated portions converges inwardly, toward a central portion of the floor.

11. The process platform of claim 8, wherein the central support includes a set of end panel portions converging upwardly from the floor toward the upper portion of the central support, and the bifurcated portions integrally joined to its respective end panel portions from the floor to a location where its respective end panel portions coverage.

12. A moldable plastic, distortion and warp resistant process platform for wafer carriers, the process platform being suspendable by a control apparatus for dipping wafer carriers into various liquids for processing semiconductor wafers in the wafer carriers, the process platform comprising:
   a generally central support having upper and lower portions, the upper portion having engagement means for engaging the control apparatus from which the process platform is suspendable, the central support being apertured for permitting fluid flow through the support; and
   a floor for engaging the wafer carriers and being integral with the lower portion of the central support which extends generally upwardly and centrally from the floor to define two floor portions and whereby the process platform forms generally the shape of an inverted T, the floor having a periphery which comprises a gridwork of relatively small openings for permitting fluid flow therethrough, each of the floor portions having means for engaging one of the wafer carriers and a relatively large opening between said means for permitting fluid flow therethrough and to and from the wafer carriers whereby fluid flows easily through the process platform.

13. The process platform of claim 12 and each of the floor portions including a gridwork portion extending adjacent to the support and between transverse portions of the periphery of the floor, wherein each of the gridwork portions includes relatively small openings for permitting fluid flow therethrough.

14. The process platform of claim 12, wherein the gridwork of relatively small openings includes a pair of longitudinally extending portions extending transversely of each other, each of the longitudinally extending portions having two adjacent rows of openings.

15. The process platform of claim 14, wherein the openings of one of the rows of each of the longitudinally extending portions are staggered relative to the openings of its respective adjacent row.

16. The process platform of claim 12, wherein the support includes at least two elongate openings extending generally vertically in the support from approximately the lower portion to approximately the upper portion.

* * * * *